(12) United States Patent
Tortorelli et al.

(10) Patent No.: US 9,570,167 B2
(45) Date of Patent: Feb. 14, 2017

(54) APPARATUSES AND METHODS OF READING MEMORY CELLS

(71) Applicant: MICRON TECHNOLOGY, INC., Boise, ID (US)

(72) Inventors: Innocenzo Tortorelli, Cernusco Sul Naviglio (IT); Fabio Pellizzer, Boise, ID (US); Ferdinando Bedeschi, Biassono (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 65 days.

(21) Appl. No.: 14/628,824

(22) Filed: Feb. 23, 2015

(65) Prior Publication Data

US 2016/0247562 A1   Aug. 25, 2016

(51) Int. Cl.
  *G11C 13/00*   (2006.01)

(52) U.S. Cl.
  CPC ......... *G11C 13/004* (2013.01); *G11C 13/0004* (2013.01); *G11C 13/0069* (2013.01); *G11C 13/0097* (2013.01)

(58) Field of Classification Search
  CPC  G11C 13/004; G11C 13/0069; G11C 13/0097
  See application file for complete search history.

(56) References Cited

U.S. PATENT DOCUMENTS

| 8,000,135 B1* | 8/2011 | Perlmutter | G11C 11/5642 365/185.03 |
|---|---|---|---|
| 2008/0121859 A1 | 5/2008 | Campbell | |
| 2009/0052236 A1 | 2/2009 | Bae et al. | |
| 2010/0091535 A1* | 4/2010 | Sommer | G11C 8/20 365/45 |
| 2011/0038195 A1 | 2/2011 | Hamilton et al. | |
| 2013/0051123 A1 | 2/2013 | Lee et al. | |
| 2013/0155767 A1 | 6/2013 | Brand et al. | |

(Continued)

*Primary Examiner* — Hoai V Ho
*Assistant Examiner* — Tri Hoang
(74) *Attorney, Agent, or Firm* — Holland & Hart LLP

(57) ABSTRACT

A method is provided for a reading memory even if there is a threshold voltage in an overlapped threshold voltage ($V_{TH}$) region between a first state distribution and a second state distribution. The method includes ramping a bias on a memory cell a first time to determine a first threshold voltage ($V_{TH1}$) of the memory cell and determining whether the $V_{TH1}$ is within the overlapped $V_{TH}$ region. Upon determination that the memory cell is within the overlapped $V_{TH}$ region, the method further includes applying a write pulse to the memory cell; ramping a bias on the memory cell a second time to determine a second threshold voltage ($V_{TH2}$); and determining the state of the memory cell prior to receiving the write pulse based on a comparison between the $V_{TH1}$ and the $V_{TH2}$.

20 Claims, 7 Drawing Sheets

(56) References Cited

U.S. PATENT DOCUMENTS

2014/0036589 A1* 2/2014 Parthasarathy ..... G06F 11/1048
365/185.09
2016/0049209 A1* 2/2016 Pandey .................. G11C 7/12
714/721

* cited by examiner

APPARATUSES AND METHODS OF READING MEMORY CELLS

FIELD

This disclosure generally relates to memory apparatuses and methods of operating the same, and more particularly to memory arrays and methods of reading memory cells in the memory arrays, such as in cross point memory arrays.

BACKGROUND

Many memory apparatuses have a controller configured to cause a memory access operation, such as a read operation, to determine whether a memory cell in a memory array has one state (e.g., a programmed state) or another state (e.g., an erased state). In some memory apparatuses, such determination of the state of the memory cell can be based on the detected value of a threshold voltage and/or a read current associated with the memory cell. For example, a threshold voltage of a memory cell exceeding a certain voltage may be associated with the memory cell being in a programmed state, whereas a threshold voltage less than a certain voltage may be associated with the memory cell being in an erased state. It will be appreciated that while it may be desirable to have a large threshold voltage difference or a large current difference (also referred to as a window) between programmed and erased states of the memory cells, statistical distribution of resistances among the memory cells in the different states may limit or even eliminate the voltage and/or current window. Thus, there is a need for apparatuses and methods for effective reading of memory cells in a memory array, where the threshold voltage and/or threshold current window is limited or eliminated.

DETAILED DESCRIPTION

Figure 1:
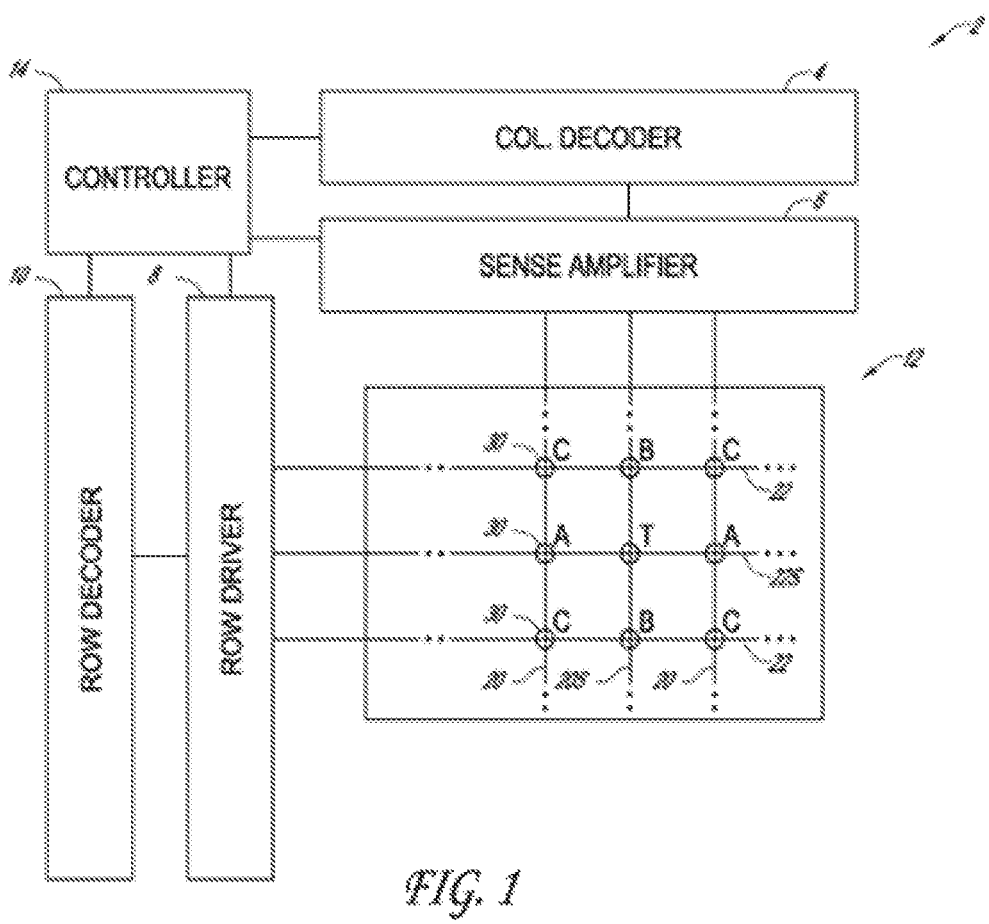
FIG. 1 is a schematic circuit block diagram of an apparatus including a memory array according to embodiments.

In some memory apparatuses, the determination of whether a memory cell in the memory array is in one state (e.g., a programmed state) or another state (e.g., an erased state) can be made based on the detected value of a threshold voltage and/or a read current associated with the memory cell. For example, a threshold voltage of a memory cell exceeding a certain voltage may be associated with the memory cell being in a programmed state, whereas a threshold voltage less than a certain voltage may be associated with the memory cell being in an erased state. In a memory array having a plurality of memory cells, a voltage window whose minimum and maximum values demarcate two states (e.g., programmed and erased memory states) is sometimes referred to as a read voltage window (RVW) associated with the two states. Under normal operation, it may be desirable to have the memory cells avoid a threshold voltage between these two voltages, to allow the memory cells within the memory array to be clearly distinguished as being in one or the other of the two states.

Generally, from a design point of view as well as a reliability point of view, it may be desirable to have a relatively large RVW. A large RVW can be obtained in a number of ways, including, for example, programming and erasing the memory cells with sufficient program and erase pulses such that the resulting window is large. A large read window can also be achieved by various means that result in a smaller statistical spread within the states. However, it will be appreciated that under some circumstances it may not be desirable or technically feasible to have sufficiently large read window due to statistical distribution, drift of states over time, material limitations or choice of device architecture, among other technological or design reasons, such that a memory array has a relatively small, zero, or even a negative RVW. The concept of a negative RVW is described more in detail below with respect to FIG. 3. In the following, apparatuses and methods are provided for enabling effective reading of memory cells in a memory array, such as a cross point array, despite a risk of the RVW being limited, zero or negative due, for example, to drift in memory and/or selector devices.

It will be noted that terminologies used for various states (programmed vs. erased) may be referred to as, e.g., 0 vs. 1, SET vs. RESET, low resistance state (LRS) v. high resistance state (HRS), on vs. off, etc. depending on the memory technology. In addition, the small or reduced RVW can occur due to various mechanisms depending on the technology, e.g., charge loss, structural relaxation, atomic diffusion, etc. It will be appreciated that irrespective of the specific terminology or physical mechanisms associated with the various states, the concepts embodied herein apply irrespective of the specific technology. In addition, in technologies where more than two states exist, the concepts embodied herein can apply to any of the states.

While some embodiments are described herein with respect to cross-point memory arrays as an example, accessing devices as described herein may also have application to other types of memory arrays and to outside the memory array context, e.g., switches, antifuses, etc. Similarly, while embodiments are described with respect to memory cells incorporating Ovonic Threshold Switch (OTS) and/or memory storage elements that incorporate chalcogenide materials, the principles and advantages of the techniques and structures taught herein may be useful for other materials that demonstrate thresholding behavior.

As used herein, a write access operation can be a program or an erase operation. For a variable resistance memory cell, a program operation can also be referred to as a RESET operation, which can change the resistance state of the memory cell from a relatively low resistance state to a relatively high resistance state. Similarly, an erase operation, which for a variable resistance memory can also be referred to as a SET operation, can change the resistance state of the memory cell from a relatively high resistance state to a relatively low resistance state. It will be understood that the above terminology is arbitrary but conventional for referring to write operations for applying different memory states on variable resistance memory cells.

In addition, while SET and RESET states may herein be used to refer to states corresponding to a memory cell in general, when the memory cell includes a storage element and a selector element where the selector element does not undergo a stable change in resistance, it will be understood that the distinction between SET and RESET states of the memory cell originate from the resistance difference of the storage element.

In some embodiments, SET and RESET states may correspond to the "1" state and a "0" state, respectively, in a single bit-per-cell memory system. However, the states "1" and "0" as they relate to high and low resistance states may be used interchangeably to mean the opposite. In other embodiments, there may be more than two resistance states. For example, a memory cell can have four states, e.g., first, second, third, and fourth resistance states that may correspond to the "00," "01," "10", and "11" states in a two bits-per-cell memory system. Yet other embodiments are possible, where first through eighth resistance states represent the states in a three-bits-per cell memory system, and where first through sixteenth resistance states represent the states in a four-bits-per cell memory system.

FIG. 1 schematically illustrates a circuit block diagram of a memory device 2 according to some embodiments. The memory device 2 includes a memory array 12 which comprises a plurality of columns 20 and a plurality of rows 22. The memory array 12 additionally comprises a plurality of memory cells 30, one at each crossing between a column 20 and a row 22. By convention, the columns 20 may also be referred to as digit lines, particularly as bit lines, and rows 22 may also be referred to as word lines.

The memory device 2 additionally includes a column decoder 4 electrically connected to the columns 20 and a row decoder 10 electrically connected to the rows 22 according to some embodiments.

The memory device 2 additionally includes a row driver 8, which can be a word line driver, electrically connected to the rows 22, and a sense amplifier 6 electrically connected to the columns 20. During an access operation, one of the rows 22 and one or more of the columns 20 specified by an address in a command are activated.

Still referring to FIG. 1, in some embodiments, the memory array 12 is further connected to a memory controller 14 configured to control the various access operations on the memory array 12, including write and read operations. In operation, the memory controller 14 configured to receive signals from a processor to access one or more memory cells 30 in the memory array 12. The controller 14 is in turn configured to transmit a memory access command to the memory array 12 through the column decoder 4 and the row decoder 10. A physical address of a memory cell 30 to be accessed may be specified by a memory cell address included in the memory access command. The memory cell address can include a column address and/or a row address corresponding to the column and the row to be activated (column 20S and row 22S in FIG. 1) in order to access a target memory cell (T cell in FIG. 1). Upon receiving the memory cell address, the column decoder 4 is configured to decode a column address and select a column to be activated and the row decoder 10 is similarly configured to decode a row address and select a row to be activated. When the access operation is a write operation, the memory controller 14, by causing activation of a selected column and/or a selected row, is configured to cause a state change of the memory cell 30.

In operation, the memory cells 30 of memory array 10 can be categorized based on different biases the memory cells 30 receive. The target cell T is located at an intersection between the selected column 20S and the selected row 22S. In addition, memory cells along the selected column 20 that are inhibited by unselected rows are labeled as B cells, while memory cells along the selected row 22 that are inhibited by unselected columns are labeled as A cells. The remaining cells at intersections of unselected rows and columns are labeled as C cells.

Figure 2:
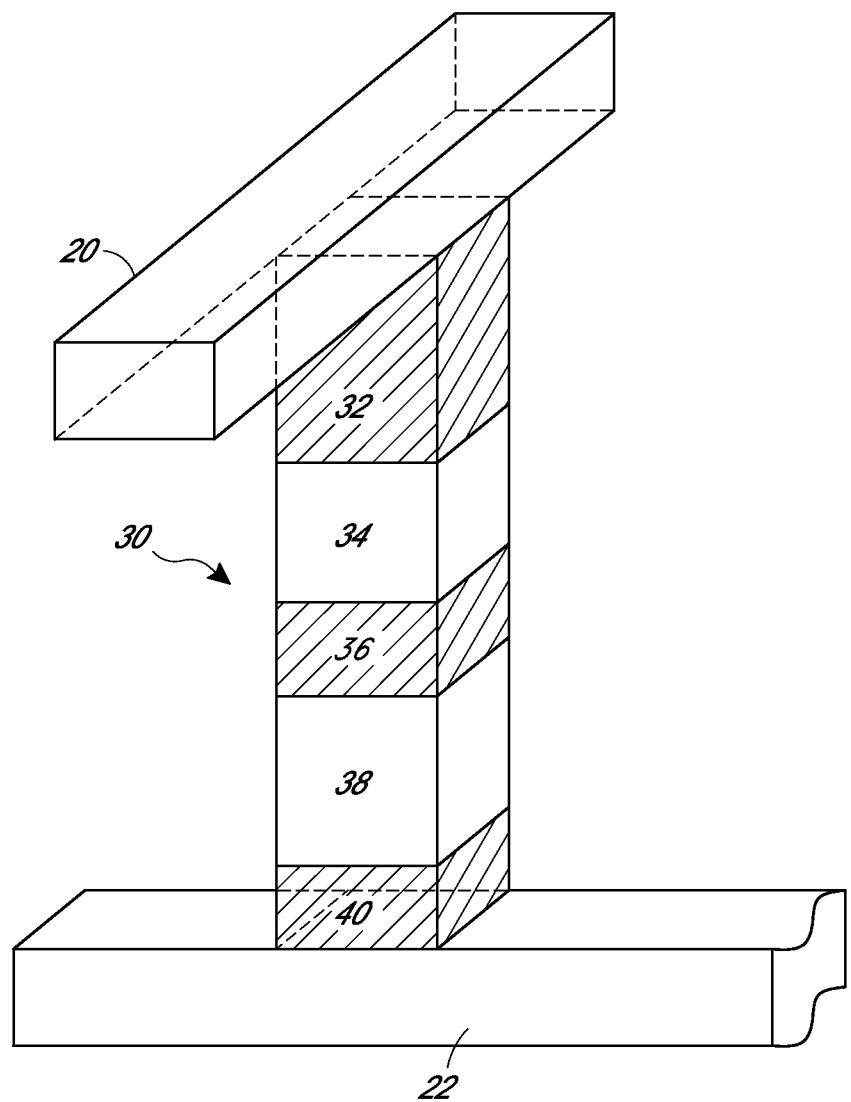
FIG. 2 is a schematic three-dimensional isometric view depicting a memory cell incorporating chalcogenide materials according to embodiments.

FIG. 2 depicts a memory cell 30 in a cross-point memory array similar to the memory array 12 described above with respect to FIG. 1, according to some embodiments. The memory cell 30 in FIG. 2 is a variable resistance memory cell and can change between first and second resistance states in response to electrical signals. While only one memory cell 30 is depicted in FIG. 2 for clarity, it will be appreciated that there can be a plurality of memory cells 30 in a cross-point memory array having a plurality of column lines 20 and a plurality of row lines 22. In the illustrated embodiment, the memory cell 30 includes a storage element 34 and a selector element 38 that are configured to be electrically accessed through a column line 20, which can be a digit line, and a row line 22, which can be a word line. The memory cell 30 is in a stack configuration and can further include a first electrode 32 connecting the column line 20 and the storage element 34, a middle electrode 36 connecting the storage element 34 and the selector element 38, and a second electrode 40 connecting the selector element 38 and the row line 22.

In some embodiments, one or both of the selector element 38 and the storage element 34 can comprise chalcogenide materials. The storage element 34 can comprise a chalcogenide material that can undergo a phase change that is stable and nonvolatile at room temperature. On the other hand, the selector element 38 can comprise a chalcogenide material that does not undergo a similar stable and nonvolatile phase change. When the storage element 34 includes a chalcogenide material, the variable resistance memory cell 30 may be referred to as a phase change memory cell.

Examples of chalcogenide materials included in the storage element 34 include chalcogenide compositions such as an alloy including at least two of the elements within the indium(In)-antimony(Sb)-tellurium(Te) (IST) alloy system, for example, $In_2Sb_2Te_5$, $In_1Sb_2Te_4$, $In_1Sb_4Te_7$, etc., or an alloy including at least two of the elements within the germanium(Ge)-antimony(Sb)-tellurium(Te) (GST) alloy system, for example, $Ge_8Sb_5Te_8$, $Ge_2Sb_2Te_5$, $Ge_1Sb_2Te_4$, $Ge_1Sb_4Te_7$, $Ge_4Sb_4Te_7$, etc. Other chalcogenide alloy systems that can be included in the storage element 34 include Ge—Te, In—Sn, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Sn—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. The hyphenated chemical composition notation, as used herein, indicates the elements included in a particular mixture or compound, and is not intended to represent a particular stoichiometry involving the indicated elements.

Examples of chalcogenide-based selector element 38 includes a two-terminal selector comprising a chalcogenide material, which is sometimes referred to as an Ovonic Threshold Switch (OTS). An OTS may include a chalcogenide composition including any one of the chalcogenide alloy systems described above for the storage element 34. In addition, the selector element 38 may further comprise an element such as As to suppress crystallization. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

Examples of non-chalcogenide-based selector elements include a two terminal device (e.g., a switch), such as a diode, a tunnel junction, or a mixed ionic electronic conduction switch (MIEC), among other two terminal devices. Alternatively, examples of the selector element include a three terminal device (e.g., a switch), such as a field effect transistor (FET) or a bipolar junction transistor (BJT), among other switching elements.

Still referring to FIG. 2, the memory cell 30 may be in a resistance state that may be a relatively high resistance state (HRS), also known as the RESET state, or a relatively low resistance state (LRS), also known as the SET state. The RESET and SET states can have a resistance ratio between, for example, two and 1 million.

In addition, while SET and RESET states may herein be used to refer to states of a memory cell (which may include storage and/or selector elements) as a whole, it will be understood that the distinction between SET and RESET states of the memory cell can originate from the resistance difference of the storage element.

As described above, in some embodiments, the memory cell 30 may be a phase change memory (PCM) cell. A RESET operation in a PCM cell can be performed, for example, by applying a RESET voltage or current pulse sufficient to melt at least a portion of a storage element comprising a chalcogenide material and quenching, such that at least a portion of the memory element becomes quenched-in in an amorphous phase. In addition, a SET operation in a PCM cell can be performed, for example, by applying a SET current sufficient to crystallize enough of a memory element comprising the chalcogenide material, such that its lower resistance state is distinguishable in a read operation from the higher resistance, more amorphous state (RESET state). For example, after a SET operation, a majority of the memory element material may be crystalline.

In some variable resistance memory cells, the memory cell may electrically respond, e.g., be thresholded, prior to or simultaneously as the memory cell is being written or read. For example, when one or both of the storage element and/or the selector element includes a chalcogenide material as described above, the memory cell may first undergo a threshold event at a critical voltage, referred to herein as the threshold voltage ($V_{TH}$), prior to undergoing a state change, e.g., a phase change of the storage element. As used herein, a threshold event refers to an abrupt reduction in voltage accompanied by a rapid increase in current through the memory cell. Subsequent to the threshold event, the memory cell can remain thresholded so long as a sufficient amount of current, sometimes referred to as the holding current, is maintained through the memory cell. However, embodiments disclosed herein are not limited to memory cells that display thresholding events associated with read or write operations. Instead, embodiments disclosed herein can be applied to memory cells that do not threshold, e.g., memory cells that do not undergo an abrupt reduction in voltage while still being accompanied by an abrupt increase in current through the memory cell.

Because a memory array has a plurality of memory cells, the memory array can have a distribution of SET threshold voltages SET $V_{TH}$ and a distribution of RESET threshold voltages RESET $V_{TH}$. In some memory arrays, the SET $V_{TH}$ distribution and the RESET $V_{TH}$ distribution do not overlap. In such memory array, a maximum threshold voltage (SET $V_{TH\ MAX}$) of the SET $V_{TH}$ distribution is lower compared to a minimum threshold voltage (RESET $V_{TH\ MIN}$) of the RESET $V_{TH}$ distribution, and the difference (RESET $V_{TH\ MIN}$–SET $V_{TH\ MAX}$) has a positive value that corresponds to a voltage window, referred to herein as a read voltage window (RVW) within which a determination can be made as to whether a particular memory cell being read is in a SET state or a RESET state. As described herein, a memory array that can be programmed to have nonoverlapping threshold voltage distributions between SET and RESET states is referred to as having a positive RVW. A positive RVW can be desirable for a number of reasons, including providing sufficient voltage margin for distinguishing cells in the SET states from cells in the RESET states.

In other memory arrays, the SET $V_{TH}$ distribution and the RESET $V_{TH}$ distribution overlap such that the difference (RESET $V_{TH\ MIN}$–SET $V_{TH\ MAX}$) has a negative value. As described herein, a memory array that can be programmed to have overlapping threshold voltage distributions between SET and RESET states is referred to as having a negative RVW. A memory array having a negative RVW may be used, for example, when a particular choice of memory cell materials and/or a configuration, while not providing a positive RVW, offers other benefits such as speed, energy, retention, cyclability, etc.

Figure 3:
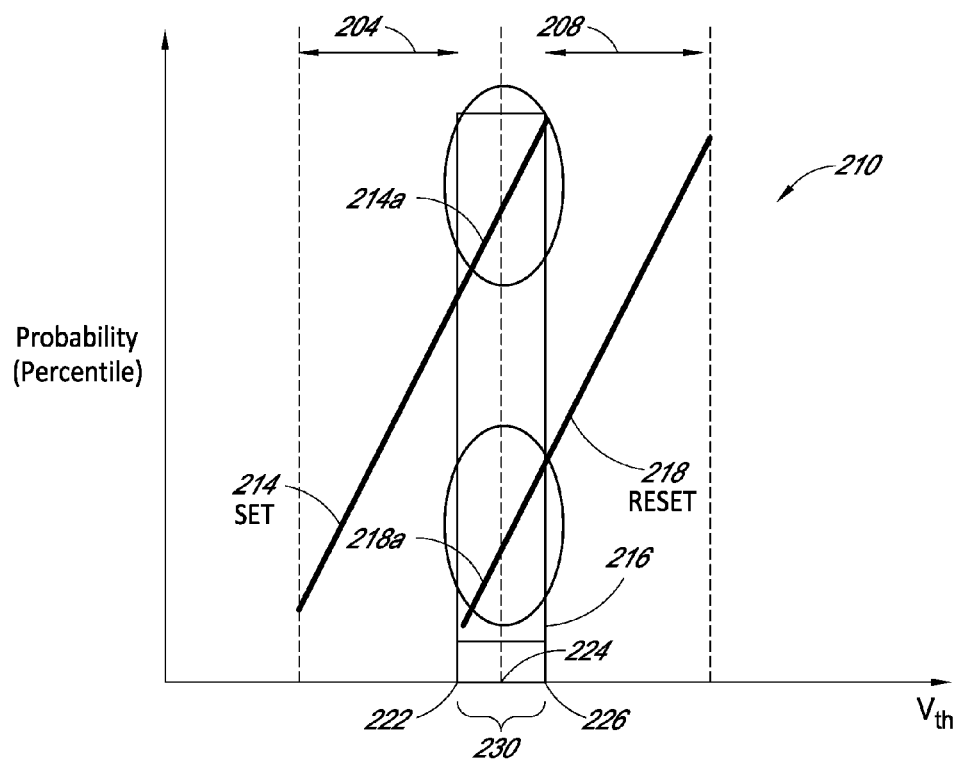
FIG. 3 is a graphical representation of threshold voltage distributions of two memory states having an overlapped threshold voltage region.

FIG. 3 is a schematic threshold distribution probability graph 210 of a memory array having a negative read voltage window (RVW). The x-axis and the y-axis of the cumulative distribution probability plot 210 represent, respectively, the threshold voltage ($V_{TH}$) of memory cells and the cumulative probability (in percentile) of memory cells having $V_{TH}$'s lower than the corresponding $V_{TH}$ of the x-axis. The graph 210 shows a SET $V_{TH}$ distribution curve 214 and a RESET $V_{TH}$ distribution curve 218 corresponding to respective distributions of memory cells in SET states and RESET states, respectively. The graph 210 shows SET state memory cells having $V_{TH}$'s in a non-overlapped SET $V_{TH}$ range 204 and RESET state memory cells having $V_{TH}$'s in a non-overlapped RESET $V_{TH}$ range 208. In addition, the graph 210 shows SET cells having $V_{TH}$'s in an overlapped SET $V_{TH}$ range 214*a* and RESET cells having $V_{TH}$'s in an overlapped RESET $V_{TH}$ range 218*a* within an overlapped $V_{TH}$ region 230. The overlapped $V_{TH}$ region 230 has a minimum 222, a median 224, and a maximum 226. The SET $V_{TH}$ distribution curve 214 has a maximum threshold voltage that is greater than a minimum threshold voltage of the RESET $V_{TH}$ distribution curve 218 such that the memory array has a negative RVW. In the overlapped $V_{TH}$ region 230, two memory cells in different resistance states (e.g., the SET state and the RESET state) may not be distinguishable by using a simple threshold read scheme.

It will be appreciated that the SET $V_{TH}$ distribution curve 214 and the RESET $V_{TH}$ distribution curve 218 can, for example, represent ranges of the respective threshold voltages defined by +/−n·σ of the memory cells within the respective distributions, where σ is a standard deviation. Depending on the error tolerance of the memory array, n can have a value between, for example, about 3 and about 5, for instance about 4. It will be understood that while the distribution curves 214 and 218 are schematically illustrated as straight lines, which correspond to Gaussian distributions, actual distribution curves can deviate from straight lines.

It has been found that, under some circumstances, for a SET state memory cell having a $V_{TH}$ within the overlapped $V_{TH}$ region 230, applying a write pulse, e.g., a RESET pulse, to the memory cell changes, e.g., increases, the $V_{TH}$ of the memory cell by a predetermined amount to a value corresponding to a non-overlapped RESET region similar to the non-overlapped RESET $V_{TH}$ range 208 described above with respect to FIG. 3. However, for a RESET memory cell within the overlapped $V_{TH}$ region 230, applying a similar write pulse, e.g., a RESET pulse to the memory cell does change the $V_{TH}$ in a similar manner, e.g., does not increase, the $V_{TH}$ of the memory cell. Thus, by applying a write pulse, e.g., a RESET pulse to a memory cell within the overlapped $V_{TH}$ region 230, a determination can be made as to whether the memory cell prior to receiving the write pulse was a SET state memory cell or a RESET state memory cell.

Figure 4:
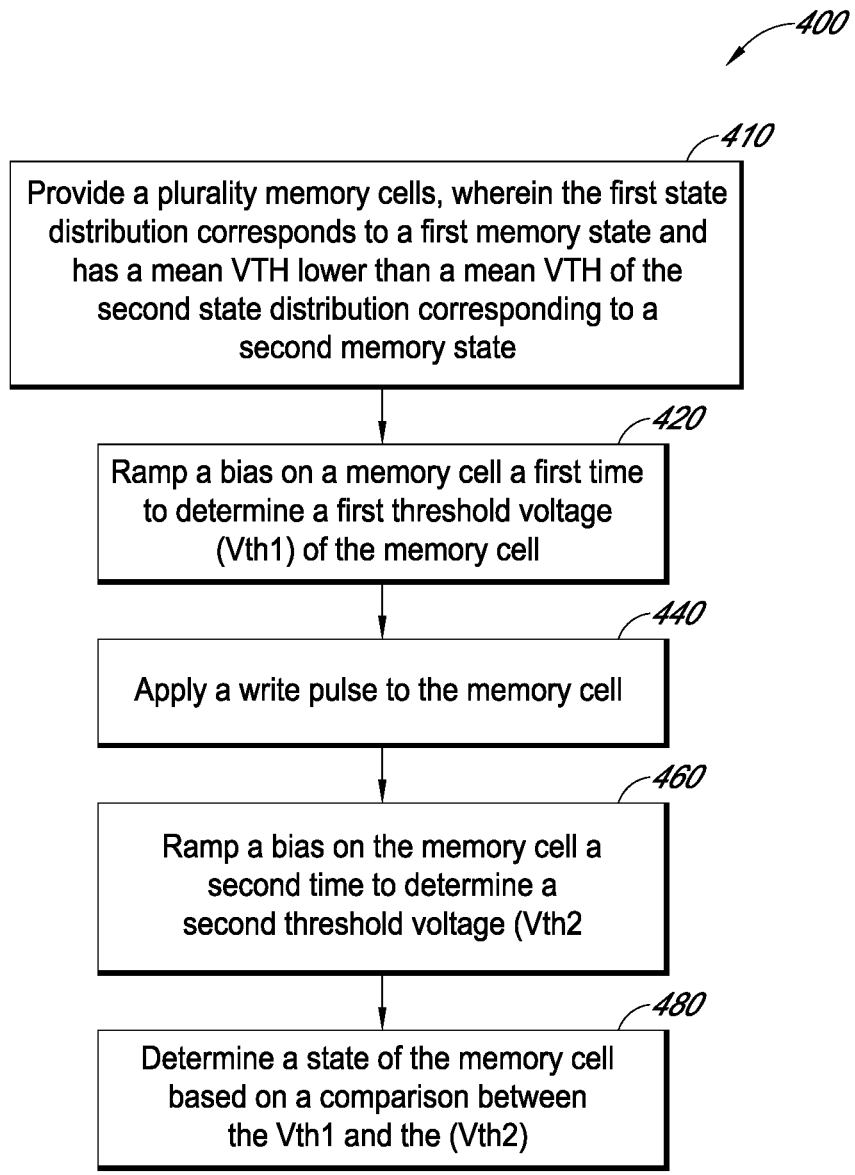
FIG. 4 is a flow chart illustrating a method of reading a memory cell by comparing threshold voltages before and after application of a write pulse according to embodiments.
Figure 5:
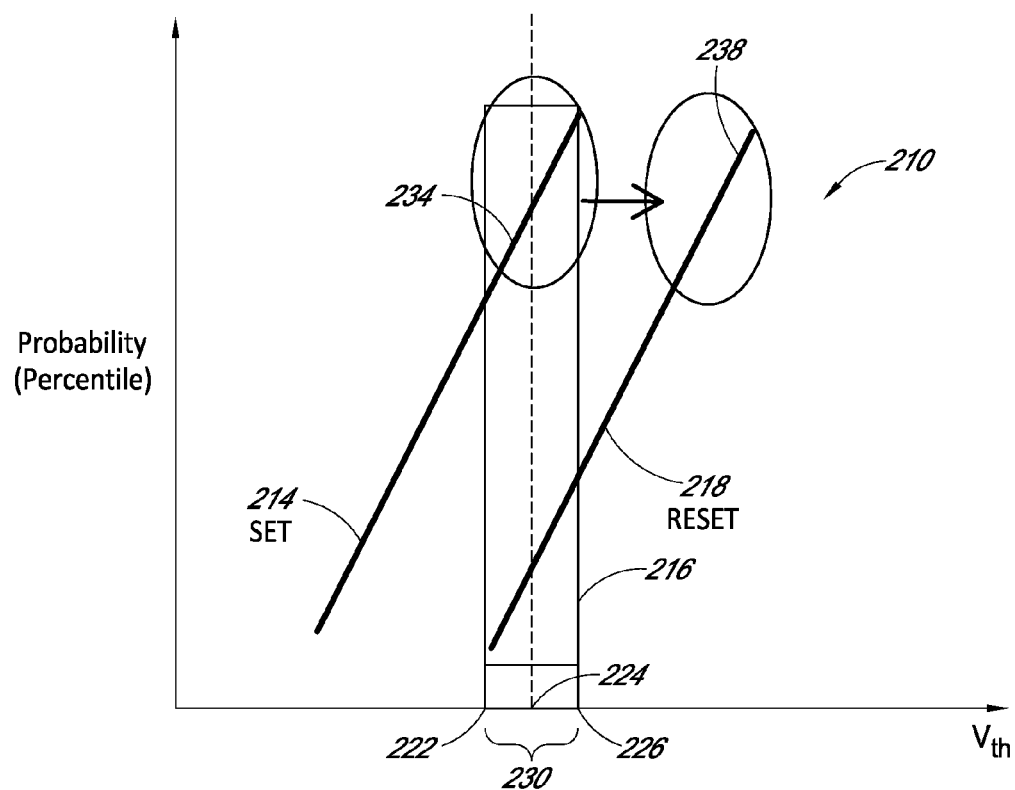
FIG. 5 a graphical representation of reading a memory cell having a threshold voltage within an overlapped region by altering the state of the memory cell with a write pulse.

FIG. 4 illustrates a method 400 of reading memory cells within an overlapped electrical response region, such as an overlapped $V_{TH}$ region. For illustrative purposes, the method 400 of FIG. 4 will be described using a schematic threshold distribution probability graph 210 in FIG. 5. The illustrated method can be applied to distinguish memory states of memory cells in an overlapped $V_{TH}$ region 230 (FIG. 5), in which two memory cells in different resistance states (e.g., the SET state and the RESET state) may have same or similar $V_{TH}$'s. In FIG. 5, similar to FIG. 3, after writing to at least a subset of memory cells in a memory array, the memory array has SET memory cells represented by a SET $V_{TH}$ distribution curve 214 and RESET memory cells represented by a RESET $V_{TH}$ distribution curve 218, where some SET cells and RESET cells overlap in $V_{TH}$ within the overlapped Vth region 230.

Referring to FIG. 4, the method 400 begins by providing 410 a plurality of memory cells, which can have an overlapped electrical response region, e.g., an overlapped threshold voltage ($V_{TH}$) region, between a first state distribution, e.g., a SET distribution, and a second state distribution, e.g., a RESET distribution, where the first state distribution corresponding to a first memory state, e.g., a SET state, and has a mean $V_{TH}$ lower than a mean $V_{TH}$ of the second state distribution corresponding to a second memory state, e.g., a RESET state. The method 400 includes ramping up 420 a bias on a memory a first time to determine a first electrical response, e.g., a first threshold voltage ($V_{TH1}$), e.g., by ramping until the memory cell thresholds a first time at the $V_{TH1}$. Based on the value of the $V_{TH1}$, the method 400 determines whether a memory cell is within the overlapped $V_{TH}$ region (230, FIG. 5). That is, if the memory cell thresholds at the first $V_{TH1}$ that is below a maximum $V_{TH}$ but above a minimum $V_{TH}$ of overlapped $V_{TH}$ region 230, it is determined that the thresholded memory cell has a $V_{TH}$ within the overlapped $V_{TH}$ region 230. Once the determination that the $V_{TH1}$ is within the overlapped $V_{TH}$ region 230, the method 400 proceeds to applying 440 a pulse, e.g., a write pulse, to the memory cell that thresholded at the first $V_{TH}$, to determine the state of the memory cell based on the effect of the write pulse on the memory cell. The write pulse can be, e.g., a RESET pulse. To determine the effect of the write pulse, the method 400 additionally includes ramping up 460 a bias on the memory cell a second time to determine a second electrical response, e.g., a second threshold voltage ($V_{TH2}$), e.g., by ramping until the memory cell thresholds a second time at the $V_{TH2}$. Then, based on the determined $V_{TH1}$ and the $V_{TH2}$, the method 400 continues, based on a comparison between the first $V_{TH}$ and the second $V_{TH}$, determining 480 the state of the memory cell. As described above, the determination of the state can be made based on whether or not the $V_{TH}$ of the memory cell has changed, e.g., increased. In some embodiments, determining includes determining the amount of change, e.g., the amount of increase, exceeds a predetermined amount as a result of applying 440 the write pulse. That is, as shown in FIG. 5, if the memory cell is one of SET cells having a $V_{TH}$ within the overlapped $V_{TH}$ region 230 (represented by SET $V_{TH}$ range 234), the $V_{TH}$ of the memory cell shifts to a RESET state at a high RESET $V_{TH}$ (RESET $V_{TH\ HIGH}$) range 238. On the other hand, if the memory cell is one of RESET cells having a $V_{TH}$ within the overlapped $V_{TH}$ region 230 (similar to the RESET $V_{TH}$ range 218a in FIG. 3), the $V_{TH}$ of the memory cell does not substantially shift. Thus, based on the response of the memory cell to the write pulse, a determination can be made as to what the state of the memory cell was prior to receiving the write pulse.

It will be appreciated that the method 400 of FIG. 4 as well as methods described in the following embodiments can be used synergistically with an error correction code (ECC). For example, in the method 400 of FIG. 4, upon determining that the thresholded memory cell has a $V_{TH}$ within the overlapped $V_{TH}$ region 230 by thresholding a first time at a first $V_{TH}$, an ECC can be applied, as understood in the art, instead of proceeding to applying 440 the write pulse. In other embodiments, an ECC can be applied in addition to applying 440 the write pulse.

Figure 6:
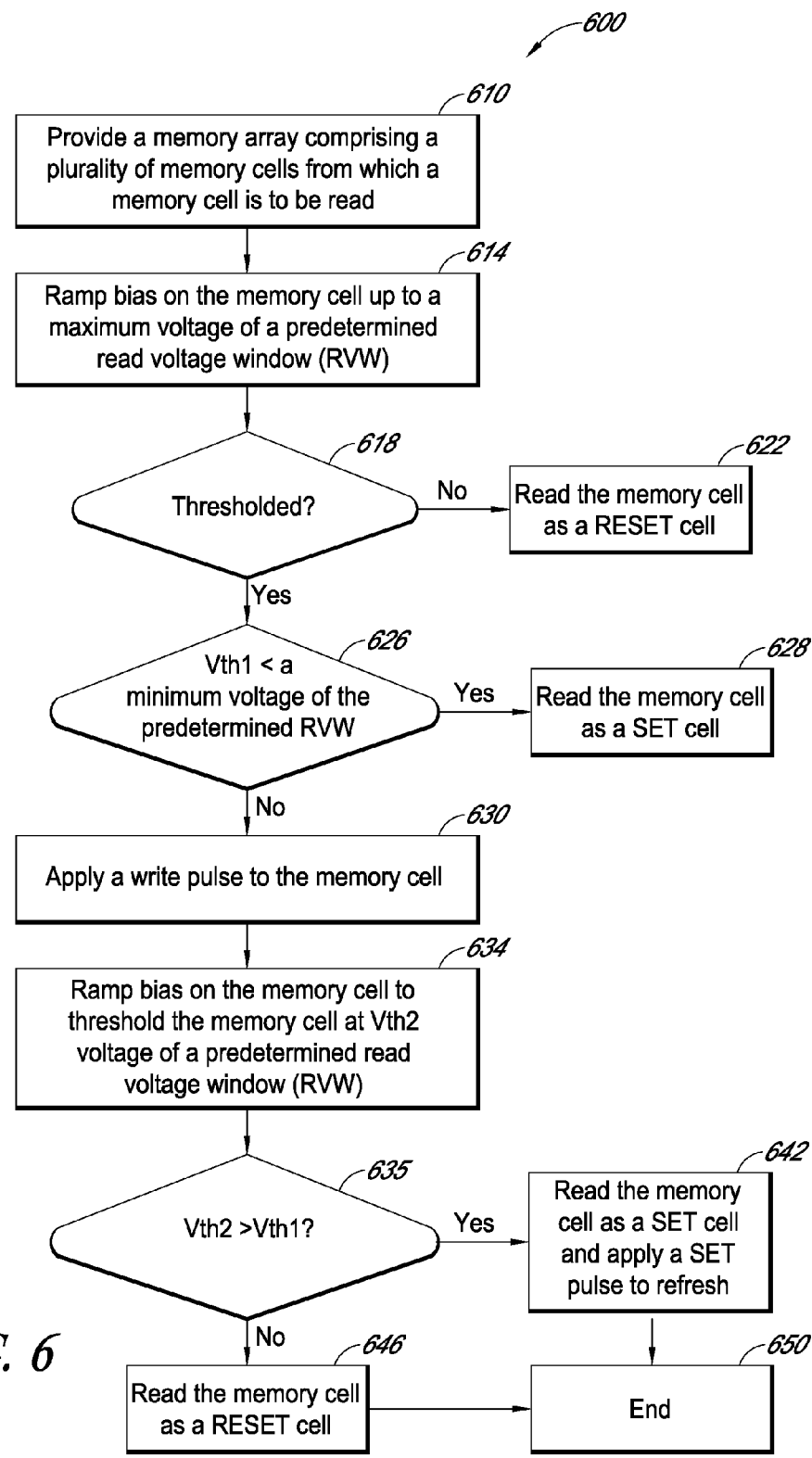
FIG. 6 is a flow chart illustrating a method of reading a memory cell by comparing threshold voltages before and after application of a write pulse according to embodiments.

In the following, in reference to FIG. 6, a detailed description of a method 600 of reading memory cells, which can be within an overlapped $V_{TH}$ region when present, is described, alongside the schematic threshold distribution probability graph 210 in FIG. 5. FIG. 6 illustrates, generally similar to FIG. 4, a method of distinguishing the state of a memory cell having a $V_{TH}$ within an overlapped $V_{TH}$ region by using a write pulse to potentially alter the state of the memory cell within the overlap region, and inferring therefrom that the state of the memory cell was a SET state prior to receiving the test pulse, according to some embodiments. The method 600 comprises providing at a block 610 a memory array comprising a plurality of memory cells, from which a memory cell is to be read. The memory cell to be read can be in, e.g., a SET state or a RESET state.

The method 600 additionally includes, at a box 614, ramping a bias on the memory cell from an initial voltage up to a maximum voltage of a predetermined read voltage window (RVW). The maximum voltage of the predetermined RVW may correspond to, e.g., the maximum voltage 226 of the overlapped $V_{TH}$ region 230 in FIG. 5.

Ramping 614 the bias can include, e.g., linear or stepped ramping from an initial voltage. The initial voltage can be, e.g., an inhibit bias that an inhibited memory cell is under. For example, referring back to FIG. 1, in some embodiments, the initial bias may be a bias experienced by B cells along a selected column and inhibited by unselected rows, a bias experienced by A cells along a selected row and inhibited by unselected columns, or a bias experienced by C cells s at intersections of unselected rows and unselected columns. In other embodiments, the initial bias may be a bias at or lower than the lowest voltage of the SET $V_{TH}$ distribution curve. As described above, the lowest voltage of the SET $V_{TH}$ distribution curve 214 of FIG. 5 may not necessarily be the lowest voltage among the cells in a SET state. Instead, the initial bias may be a voltage that may be, e.g., 3σ, 4σ, or 5σ below a median (224 in FIG. 5) of the SET $V_{TH}$ distribution curve. In yet other embodiments, the initial bias may be a bias between one of the inhibit biases of one of A, B, or C cells and the lowest voltage of the SET $V_{TH}$ distribution curve 214.

In some embodiments, ramping the bias comprises ramping from an initial bias to a threshold bias at a ramp rate that is substantially slower than an RC delay associated with the variable resistance memory cell. For instance, the ramp rate may be between about 0.001 V/ns and about 10 V/ns, between about 0.1 V/ns and about 10 V/ns or between about 1 V/ns and about 10 V/ns. In some embodiments, the bias may be ramped in a substantially linear fashion. In other embodiments, the bias may not be ramped in a linear fashion, e.g., may be step-wise ramped. In the latter case, a ramp rate refers to an average ramp rate from the initial voltage to the voltage at which the memory cell thresholds.

The method 600 additionally includes, after ramping, determining at a decision block 618 whether the memory cell has thresholded or not. Upon determining at the decision block 618 that the memory cell has not thresholded, the memory is read at a block 622 as having a RESET state within a nonoverlapping portion of the RESET $V_{TH}$ distribution curve 218 (FIG. 5), and the method 600 ends. On the other hand, upon determination at the decision block 618 that the memory cell has thresholded, the memory cell is determined to be outside of the nonoverlapping portion of the RESET $V_{TH}$ distribution curve 218, i.e., either in the overlapped $V_{TH}$ region 230 of FIG. 5, or in a nonoverlapping portion of the SET $V_{TH}$ distribution curve 214 of FIG. 5, and the method 600 continues.

Upon determination that the memory cell has thresholded at the decision block 618, the method 600 continues to a decision block 626 to determine whether the $V_{TH}$ of the memory cell is in the overlapped $V_{TH}$ region 230 of FIG. 5 or else in the nonoverlapping portion of the SET $V_{TH}$ distribution curve 214 of FIG. 5. This determination is made, e.g., by determining whether a first threshold voltage ($V_{TH1}$) is less than a minimum voltage of the predetermined read voltage window (RVW). The minimum voltage of the predetermined RVW may correspond to, e.g., the minimum voltage 222 of the overlapped $V_{TH}$ region 230. Upon determining that the $V_{TH}$ is less than the minimum voltage 222 of the overlapped $V_{TH}$ region 230, the memory is read at a block 628 as having a SET state within a nonoverlapping portion of the SET $V_{TH}$ distribution curve 214 of FIG. 5, and the method 600 ends.

On the other hand, upon determining that the $V_{TH}$ is greater than or equal to the minimum voltage 222 of the overlapped $V_{TH}$ region 230, the memory cell is determined to have a $V_{TH}$ within the overlapped $V_{TH}$ region 230. This is because, since it has been determined at the decision block 618 that the memory cell has a $V_{TH}$ that outside of the nonoverlapping portion of the RESET $V_{TH}$ distribution curve 218 (FIG. 5), and determined at the decision block 626 that the memory cell has a $V_{TH}$ that is outside of the nonoverlapping portion of the SET $V_{TH}$ distribution curve 214 (FIG. 5), it can be determined by a process of elimination that the memory cell has a $V_{TH}$ within the overlapped $V_{TH}$ region 230 (FIG. 5). Upon determining that the $V_{TH}$ is greater than the minimum voltage 222 of the overlapped $V_{TH}$ region 230, the method 600 continues to block 630, at which a write pulse, e.g., a RESET pulse, is applied to the memory cell.

Still referring to FIG. 6, at a block 634, the method 600 additionally includes ramping a bias on the memory cell a second time from an initial voltage until the memory cell thresholds at a second threshold voltage $V_{TH2}$. Similar to the block 614, ramping the bias at block 634 can include, e.g., linearly or nonlinearly ramping from one of the initial voltages described above with respect to the block 614.

Still referring to FIG. 6, at a decision block 635, a determination is made as to whether or not the state of the memory cell within the overlapped $V_{TH}$ region 230 was, prior to receiving the write pulse at the box 630, a memory cell having a RESET state or a SET state. This determination can be made by, e.g., comparing the $V_{TH2}$ determined at the box 634 to the $V_{TH1}$ determined at the box 614. In some embodiments, one or both of the $V_{TH1}$ and $V_{TH2}$ may be stored until the comparison is carried out, for example in sample and hold circuits, as discussed later with respect to FIG. 7.

As described above with respect to FIG. 4, the state of the memory cell prior to receiving the write pulse at the box 630 can be inferred, based on whether the $V_{TH2}$ is greater than $V_{TH1}$ ($V_{TH2} > V_{TH1}$). As described above, upon determining that $V_{TH2}$ is not greater than $V_{TH1}$, e.g., about the same or less than $V_{TH1}$, the memory cell is determined to have been a RESET cell within the overlapped $V_{TH}$ region 230 (FIG. 5) prior to receiving the write pulse, and the memory cell is read at a block 646 as being a RESET cell. The method then ends at a box 650. On the other hand, upon determining that $V_{TH2}$ is greater than $V_{TH1}$, the threshold voltage of the memory cell has been altered by the application of the pulse at the box 630, the memory cell is determined to have been a SET cell within the overlapped $V_{TH}$ region 230 prior to having received the write pulse, e.g., a RESET pulse. The memory cell is then read as being a SET cell at a box 642. Once this determination is made, because the state of the memory cell has been altered by the write pulse the memory cell can be placed back into the SET $V_{TH}$ distribution curve 214 by a refresh pulse, e.g., a SET pulse, at the box 642. The method then ends at the box 650.

Figure 7:
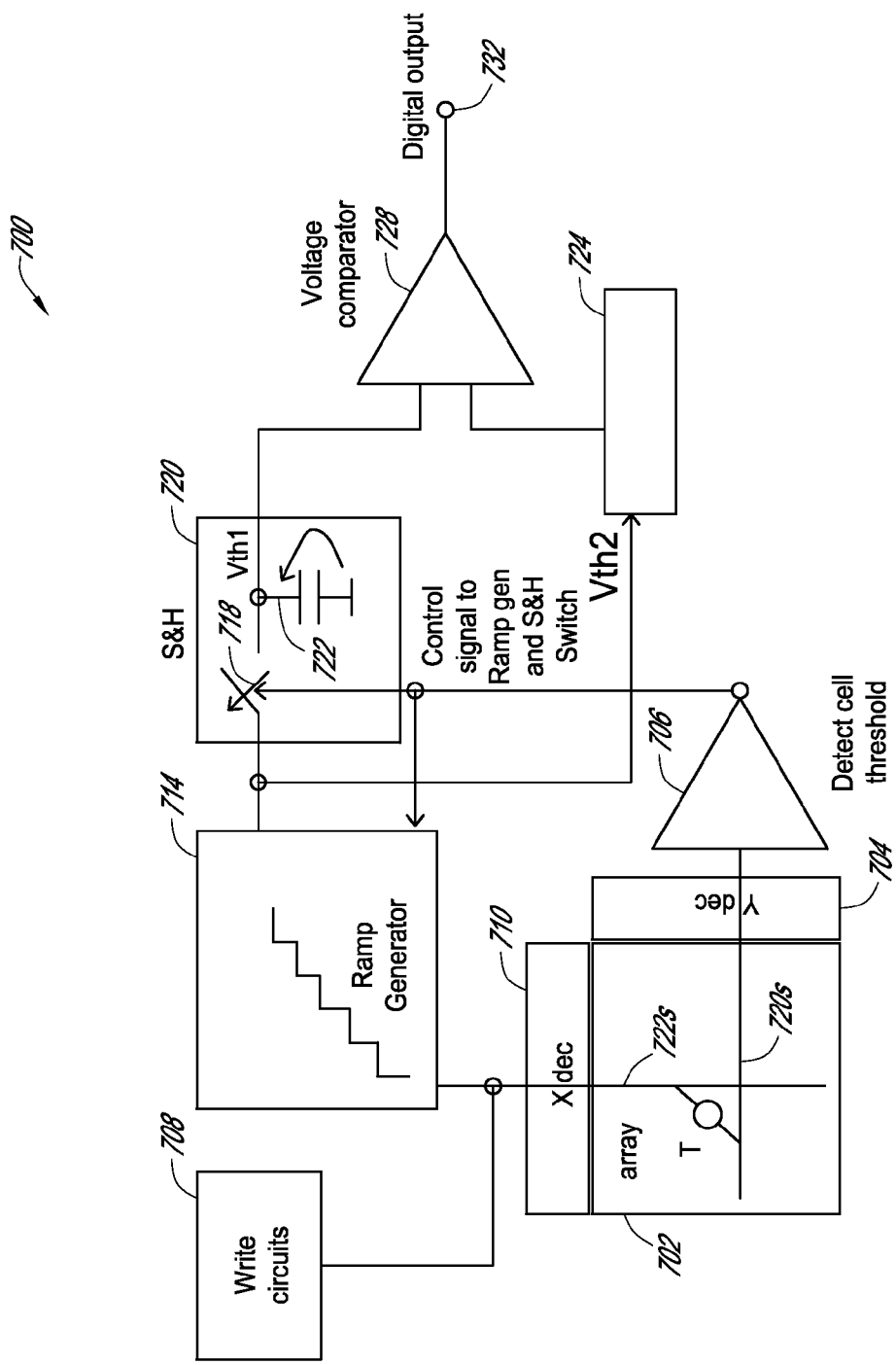
FIG. 7 is a schematic representation a memory apparatus configured to read a memory cell by comparing threshold voltages before and after application of a write pulse according to embodiments.

FIG. 7 illustrates an apparatus 700 having a memory array that is configured to read memory cells within the memory array that can have overlapped $V_{TH}$ distributions, similar to that described above with respect to FIG. 5. The apparatus 700 is configured to distinguish the state of a memory cell having a $V_{TH}$ within the overlapped $V_{TH}$ region by applying a write pulse, e.g., a RESET pulse, to alter a state of a memory cell, and inferring therefrom that the state of the memory cell prior to receiving the write pulse, according to some embodiments. The memory apparatus has a memory array 702, which can be a cross-point array similar to the memory array 12 described with respect to FIG. 1. The memory array 702 has a plurality of memory cells (only one selected cell T shown for clarity) at intersections between a plurality of rows (only one selected row 722S shown for clarity) and a plurality of columns (only one selected column 720S shown for clarity). The selected memory cell T can be a memory cell within an overlapped $V_{TH}$ region, similar to as described above with respect to FIGS. 4-6.

The rows are connected to a row (X) decoder 710 and the columns are connected to a column (Y) decoder 704, similar to as described with respect to FIG. 1. The rows are connected to write circuits 708, which includes row drivers, similar to the row driver described above with respect to FIG. 1. The write circuits 708 are configured to cause the write pulse, e.g., a RESET pulse, similar to as described above with respect to FIGS. 4 and 6. The columns are connected to a sense amplifier 706 similar to that described above with respect to FIG. 1. Although not shown, a controller similar to the controller 14 described with respect to FIG. 1 is communicatively coupled to the write circuits 708 and to the sense amplifier 706.

According to embodiments, the apparatus 700 includes a ramp generator 714 configured to receive a control signal from the memory controller (not shown), which causes the ramp generator 714 to ramp a bias on the selected memory cell T. The ramp generator 714 can include, e.g., a charge pump that can ramp up a voltage on the selected row 722S. The ramp generator 714 is configured to ramp up the voltage from an initial voltage until the memory cell undergoes a first thresholding event at $V_{TH1}$ in a similar manner as described above with respect to the process box 614 of FIG. 6, and is further configured to ramp up the voltage from an initial voltage until the memory cell undergoes a second thresholding event at $V_{TH2}$ in a similar manner as described above with respect to the process box 634 of FIG. 6.

The apparatus 700 additionally includes a first sample and hold circuit 720 and a second sample and hold circuit 724 that are configured to detect and store therein voltages corresponding to the $V_{TH1}$ and the $V_{TH2}$, respectively, using the sense amplifier 706. The storage of voltages corresponding to the $V_{TH1}$ and the $V_{TH2}$ can be routed to the first and second sample and hold circuits 720 and 724, respectively, by, e.g., a switching unit 718. In the illustrated embodiment, the first sample and hold circuit 720 includes a capacitor, e.g., a metal-oxide-semiconductor (MOS) capacitor, that stores a charge corresponding to the voltage of $V_{TH1}$. However, other suitable forms of circuits that can hold or store a value corresponding to $V_{TH1}$ can be used. Although not shown, the second sample and hold circuit 724 can have similar circuit structure as that of the first sample and hold circuit 720.

Still referring to FIG. 7, the apparatus 700 additionally includes a voltage comparator 728 configured to, after detecting and storing the $V_{TH1}$ and $V_{TH2}$ in the first and second sample and hold circuits 720 and 724, comparing $V_{TH2}$ against $V_{TH1}$ to determine the state of the memory cell T based on whether $V_{TH2}$ is greater than $V_{TH1}$, similar to as described above with respect to boxes 635, 646 and 642. The results of the comparison can be output at node 732.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method of reading a memory cell in a memory array that can have an overlapped electrical response region between a first state distribution a second state distribution, comprising:
   proving a plurality memory cells, wherein the first state distribution corresponds to a first memory state and has a mean electrical response lower than a mean electrical response of the second state distribution corresponding to a second memory state;
   ramping a bias on a memory cell a first time to determine a first electrical response of the memory cell; and
   determining whether the first electrical response is within the overlapped electrical response region,
   wherein upon determining that the first electrical response is within the overlapped electrical response region, the method further comprises applying a write pulse to the memory cell, ramping a bias on the memory cell a second time to determine a second electrical response, and determining a state of the memory cell prior to receiving the write pulse based on a comparison between the first electrical response and the second electrical response.

2. The method of claim 1, wherein ramping the bias the first time comprises ramping up the bias on the memory cell until the memory cell thresholds at the first electrical response.

3. The method of claim 1, wherein ramping the bias the second time comprises ramping up the bias on the memory cell until the memory cell thresholds at the second electrical response.

4. The method of claim 1, wherein determining the state of the memory cell includes determining that the memory cell was in the first state distribution based on the second electrical response being higher than the first electrical response.

5. The method of claim 1, wherein determining the state of the memory cell includes determining that the memory cell was in the second state based on the second electrical response being equal to or lower than the first electrical response.

6. The method of claim 1, wherein the memory cell is a variable resistance memory and the write pulse is a RESET pulse.

7. A method of reading a variable resistance memory cell in a memory array that can have an overlapped threshold voltage ($V_{TH}$) region between a first $V_{TH}$ distribution and a second $V_{TH}$ distribution, the method comprising:
   providing a plurality variable resistance memory cells, wherein the first $V_{TH}$ distribution corresponding to a first resistance state and has a mean $V_{TH}$ lower than a mean $V_{TH}$ of the second $V_{TH}$ distribution corresponding to a second resistance state;
   determining whether the memory cell is within the overlapped $V_{TH}$ region; and
   upon determination that the variable resistance memory cell is within the
   overlapped $V_{TH}$ region, applying a pulse to the variable resistance memory cell and determining a state of the variable resistance memory cell prior to receiving the pulse
   based on determining whether a $V_{TH}$ of the variable resistance memory cell has changed as a result of applying the pulse,
   wherein determining whether the $V_{TH}$ has changed comprises ramping a bias on the variable resistance memory cell until the variable resistance memory cell thresholds.

8. The method of claim 7, wherein the pulse is a RESET pulse.

9. The method of claim 8, wherein determining the state further comprises determining the state of the variable resistance memory cell to have been a SET state prior to receiving the pulse, based on a determination that the $V_{TH}$ of the variable resistance memory cell has increased.

10. The method of claim 9, further comprising refreshing the variable resistance memory cell by applying a SET pulse.

11. The method of claim 7, wherein ramping the bias comprises ramping from an initial bias to a threshold bias at a ramp rate that is substantially slower than an RC delay associated with the variable resistance memory cell, the ramp rate being between about 0.001 V/ns and about 10V/ns.

12. An apparatus comprising:
a memory array comprising a memory cell that can be in an overlapped threshold voltage ($V_{TH}$) region between a first $V_{TH}$ distribution and a second $V_{TH}$ distribution, wherein a first state distribution corresponds to a first memory state and has a mean $V_{TH}$ lower than a mean $V_{TH}$ of a second state distribution corresponding to a second memory state; and
a memory controller configured to cause a ramping of a bias on the memory cell a first time to determine a first threshold voltage ($V_{TH1}$) of the memory cell, to determine whether $V_{TH1}$ is within the overlapped $V_{TH}$ region, and upon determination that $V_{TH1}$ is within the overlapped $V_{TH}$ region, to cause application of a write pulse after first thresholding and a ramping of a bias on the memory cell a second time to determine a second threshold voltage ($V_{TH2}$); and
a comparator to determine a memory state based on a comparison between the $V_{TH1}$ and the $V_{TH2}$.

13. The apparatus of claim 12, wherein the memory array comprises a cross-point memory array having a plurality of columns, a plurality of rows, and a plurality of variable resistance cells formed at intersections of the rows and columns.

14. The apparatus of claim 13, wherein each of the variable resistance cells comprises a phase change memory cell comprising a selector element and a storage element connected in electrical series between a column and a row.

15. The apparatus of claim 14, wherein at least one of the selector element and the storage element comprises a chalcogenide material.

16. The apparatus of claim 13, wherein the apparatus further comprises a voltage ramp generator communicatively coupled to the memory controller and further connected to the rows such that upon receiving a ramp control signal, the voltage ramp generator ramps a bias on the memory cell through a row connected to the memory cell.

17. The apparatus of claim 16, wherein the voltage ramp generator comprises a charge pump.

18. The apparatus of claim 16, wherein the apparatus further comprises a first voltage storage unit configured to store a first stored voltage corresponding to the $V_{TH1}$ until the $V_{TH2}$ is determined, whereupon the $V_{TH1}$ and $V_{TH2}$ is provided to the comparator for determining the memory state.

19. The apparatus of claim 18, wherein the first voltage storage unit comprises a capacitor.

20. The apparatus of claim 18, wherein the apparatus further comprises a sense amplifier connected between the columns and the first voltage storage unit, the sense amplifier configured to sense the $V_{TH1}$ and provide the first stored voltage to the first voltage storage unit.

* * * * *